United States Patent [19]

Xie

[11] Patent Number: 5,888,885
[45] Date of Patent: Mar. 30, 1999

[54] METHOD FOR FABRICATING THREE-DIMENSIONAL QUANTUM DOT ARRAYS AND RESULTING PRODUCTS

[75] Inventor: Ya-Hong Xie, Flemington, N.J.

[73] Assignee: Lucent Technologies Inc., Murray Hill, N.J.

[21] Appl. No.: 856,270

[22] Filed: May 14, 1997

[51] Int. Cl.⁶ .................................................. H01L 21/20
[52] U.S. Cl. .............................. 438/493; 438/962; 117/89
[58] Field of Search ............................. 438/16, 962, 493; 117/85, 89; 247/14

[56] References Cited

U.S. PATENT DOCUMENTS 5,614,435  3/1997  Petroff et al. .............................. 117/85

*Primary Examiner*—Charles Bowers
*Assistant Examiner*—Keith Christianson

[57] ABSTRACT

In accordance with the invention, a uniformly spaced three-dimensional array of quantum dots is fabricated by forming a uniform grid of intersecting dislocation lines, nucleating a regular two-dimensional array of quantum dots on the intersections, and replicating the array on successively grown layers. The substrate is partitioned into a grid of in-plane lattice parameters, thereby providing a regular array of preferential nucleation sites for the influx atoms of a different size during the epitaxial process. The regularity of the array results in an equal partition of the incoming atoms which, in turn, leads to uniformly sized islands nucleating on these preferred sites. The result is a uniformly sized, regularly distributed two-dimensional array of quantum dots which can be replicated in succeeding layers.

10 Claims, 3 Drawing Sheets

METHOD FOR FABRICATING THREE-DIMENSIONAL QUANTUM DOT ARRAYS AND RESULTING PRODUCTS

FIELD OF THE INVENTION

This invention relates to a method for fabricating three dimensional arrays of quantum dots and to devices using such arrays.

BACKGROUND OF THE INVENTION

A quantum dot (QD) is a cluster of atoms whose dimensions in all directions are less than the quantum mechanical wavelength of an electron or a "hole". Quantum dots are believed to possess unique energy band structures and are contemplated for use in a variety of electro-optical devices. See, for example, C. Ulrich et al, Phys. Rev. B, Vol. 52, 12212 (1995) and H. Grabert et al, Z. Phys. B, Vol. 85, 317 (1991), both of which are incorporated herein by reference.

To exploit the unique properties of quantum dots, it is desirable to form them in regular arrays of substantially uniform size. Ideally the dots are sufficiently close together that they are coupled by quantum mechanical tunneling. Such arrays have potential applications as photodetectors, lasers and single electron transistors.

Unfortunately conventional fabrication techniques will not make such arrays with the desired uniformity and regular spacing. Accordingly there is a need for a new method for fabricating quantum dot arrays.

SUMMARY OF THE INVENTION

In accordance with the invention, a uniformly spaced three-dimensional array of quantum dots is fabricated by forming a uniform grid of intersecting dislocation lines, nucleating a regular two-dimensional array of quantum dots on the intersections, and replicating the array on successively grown layers. The substrate is partitioned into a grid of in-plane lattice parameters, thereby providing a regular array of preferential nucleation sites for the influx atoms of a different size during the epitaxial process. The regularity of the array results in an equal partition of the incoming atoms which, in turn, leads to uniformly sized islands nucleating on these preferred sites. The result is a uniformly sized, regularly distributed two-dimensional array of quantum dots which can be replicated in succeeding layers.

BRIEF DESCRIPTION OF THE DRAWINGS

The advantages, nature and various additional features of the invention will appear more fully upon consideration of the illustrative embodiments now to be described in detail in connection with the accompanying drawings.

In the drawings.

It is to be understood that these drawings are for purposes of illustrating the concepts of the invention and are not to scale.

DETAILED DESCRIPTION

Figure 1:
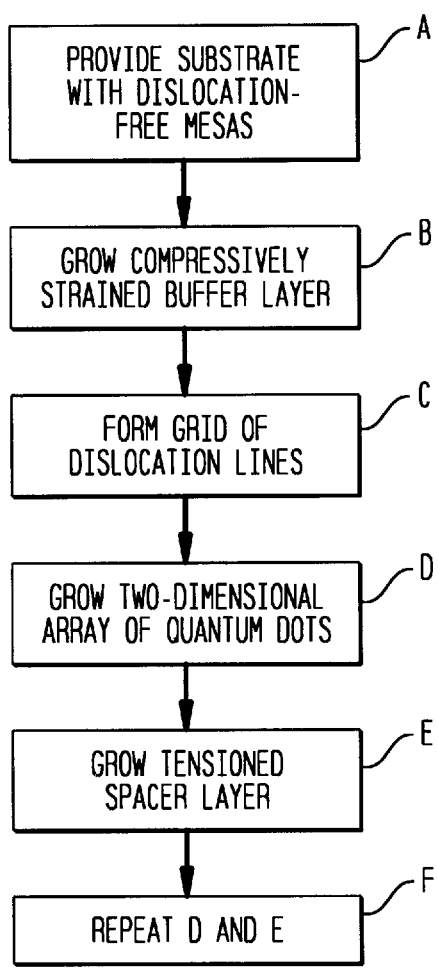
FIG. 1 is a flow diagram of an exemplary method for fabricating a three-dimensional array of quantum dots.

Referring to the drawings, FIG. 1 is a block diagram showing the steps for making a three-dimensional array of quantum dots in accordance with the invention. As shown in block A of FIG. 1, the first step is to provide a monocrystalline substrate having a working surface including one or more dislocation-free regions such as dislocation-free mesas with smooth sidewalls. The term "dislocation-free" in this context means less than 100 dislocations per $cm^2$. Such mesas can conveniently be provided on a conventional planar-surfaced monocrystalline substrate by conventional photolithographic techniques and anisotropic etching. The mesas typically have sides in the range 10 $\mu$m to 10 cm and isolating trenches with a depth in the range 1000 Angstroms to 2 $\mu$m of unmasked portions of the surface. The technique for forming dislocation-free mesa structures in various materials is described in detail in applicant's U.S. Pat. No. 5,158,907 issued Oct. 27, 1992, which is incorporated herein by reference.

Figure 2:
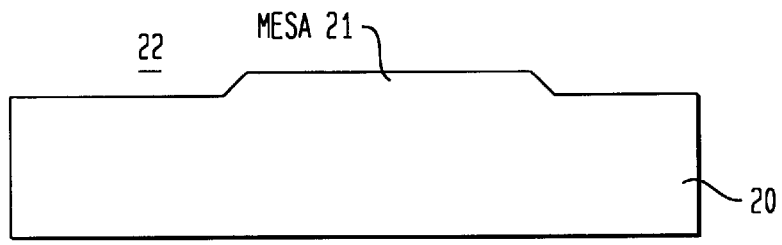
FIGS. 2–6 are schematic illustrations of a workpiece at various stages of the process of FIG. 1.

FIG. 2 is a schematic cross section of a substrate 20 having a dislocation-free mesa 21 on its working surface 22. The substrate can be (100) silicon. The working surface can be $SiO_2$, and the mesa trenches can be anisotropically etched in KOH or EDP. The objective is to form smooth sidewalls so that dislocations will not nucleate on them.

The next step shown in block B of FIG. 1 is to epitaxially grow a compressively strained buffer layer. The lattice parameter of the buffer layer should exceed that of the substrate. The layer should be grown beyond the thermal equilibrium critical thickness at which strain can be relieved by dislocation (See J. W. Mathews, *Epitaxial Growth*, Part B, Academic Press, New York (1975), which is incorporated herein by reference). For a Si substrate, the buffer layer can be GeSi with Ge concentration of 0% to 50%. The crystal growth conditions should be such that the buffer layer, as grown, is largely unrelaxed. This typically means low growth temperatures. The preferred crystal growth temperature is 300° C. to 600° C. for a growth rate in the range 0.1 Angstrom/sec. to 10 Angstroms/sec.

Figure 3:
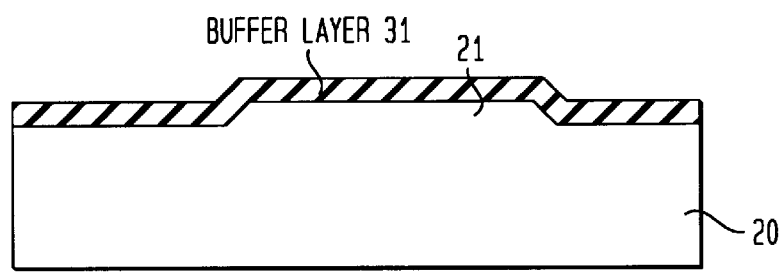

FIG. 3 shows the workpiece after the growth of the strained buffer layer 31. In the case of a silicon substrate, the buffer layer can be GeSi having a thickness in the range 100 Angstroms to 10,000 Angstroms.

The third step (block C of FIG. 1) is to form a grid of dislocation lines as by producing intersecting lines of dislocation sources on the mesa. Preferably the lines are mutually perpendicular, extending along two perpendicular sides of a rectangular mesa. Advantageously they are along the (110) crystal orientation for (100) substrates. Such lines of dislocation sources can be established by masking the surface, opening a line to expose the underlying strained buffer layer and introducing dislocation sources to the unmasked region as by ion implantation. After introducing a group of lines of dislocation sources along one of the (110) orientations, the structure is thermally annealed. The anneal is preferably a long anneal (several hours) to form a series of substantially equally spaced dislocation lines extending substantially perpendicular to the line of dislocation source across the mesa. The anneal temperature is preferably low (500–600° C. for silicon) so that massive dislocation nucleation across the mesa surface does not occur. The same process is repeated for lines of dislocation sources along the perpendicular (110) orientation. After the two patterning, implant and annealing steps, the mesa becomes divided into a grid-like misfit dislocation network.

Figure 4:
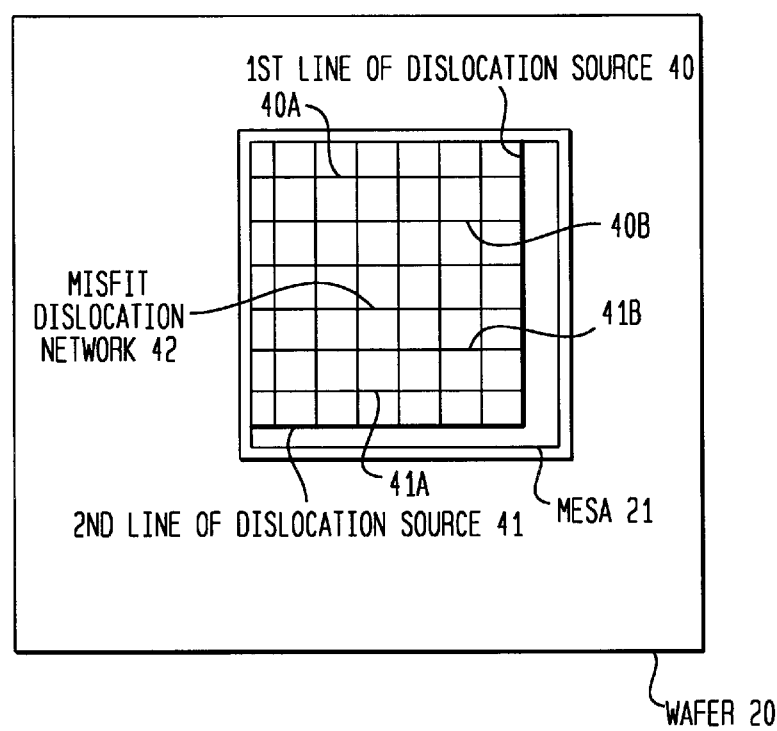

FIG. 4 is a top view of the workpiece showing the mesa 21 with a first dislocation source line 40 and a perpendicular second dislocation source line 41. A plurality of substantially equally spaced dislocation lines 40A, 40B, 40C, . . . extend perpendicular to source line 40, and a plurality of equally spaced dislocation lines 41A, 41B, 41C . . . extend from source line 41 to form a grid-like misfit dislocation network 42 extending across the mesa. Spacing between successive parallel dislocation lines is preferably a uniform value in the range 50 Angstroms to 2000 Angstroms.

The next step (block D of FIG. 1) is to epitaxially grow a two-dimensional array of quantum dots on the dislocation network. The dots grow as islands preferentially nucleating on the intersections between perpendicular dislocation lines (where the lattice constraining is smallest). The dots grow to uniform size because each island draws atoms from an equal area of the surface. The result is a uniformly distributed two-dimensional array of tiny islands of uniform size. In the exemplary case of a Si substrate and a GeSi buffer layer, the quantum dot islands can be formed by growing a Ge epitaxial layer on the relaxed GeSi. The preferred crystal growth temperature is 300° C. to 900° C. The growth rate for the dots is typically 0.1 Angstroms/sec. to 10 Angstroms/sec. The preferred dot diameter is in the range 10 Angstroms to 2000 Angstroms.

Figure 5:
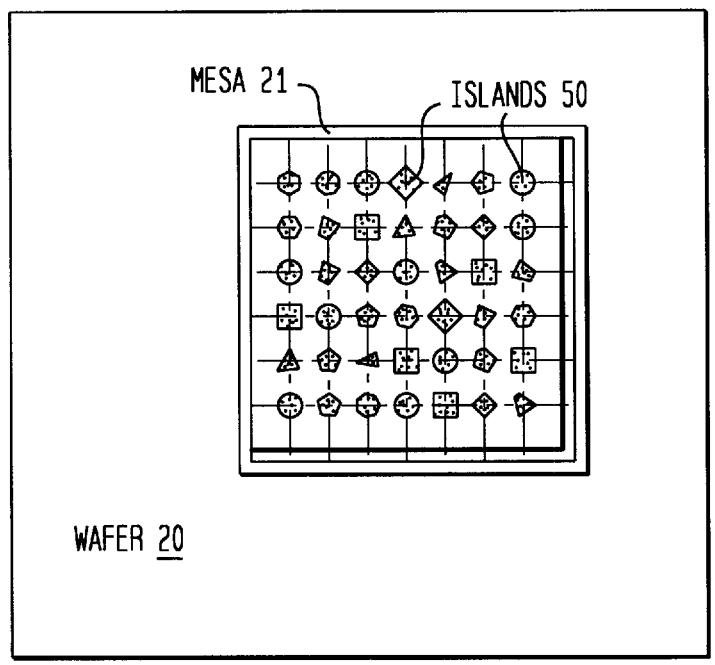

FIG. 5 is a top view of the workpiece showing Ge islands 50 grown on the intersections of dislocation lines. The Ge islands grow in a uniform two-dimensional array with a preferred separation in the range 5 Angstroms to 2000 Angstroms.

The fifth step (block E of FIG. 1) is to grow a tensioned spacing layer over the islands. The lattice constant of the spacing layer should be smaller than or equal to that of the buffer layer. This can be accomplished by epitaxially growing a thin layer of silicon on the island dotted GeSi surface. The growth of the tensioned layer provides a highly planar surface while preserving the preferential nucleation sites for a subsequent layer of quantum dots precisely over the previous layer of dots.

The three dimensional array of quantum may now be completed by repeating the last two a steps (blocks D and E) as many times as desired. The growth of new islands on top of a tensioned film over an islanded layer results in the new islands nucleating at positions over the underlying islands. Thus new Ge islands will nucleate on the Si film overlying islands on the original grid. A new film of silicon can be grown and successive layers of arrayed quantum dot islands can be formed.

Figure 6:
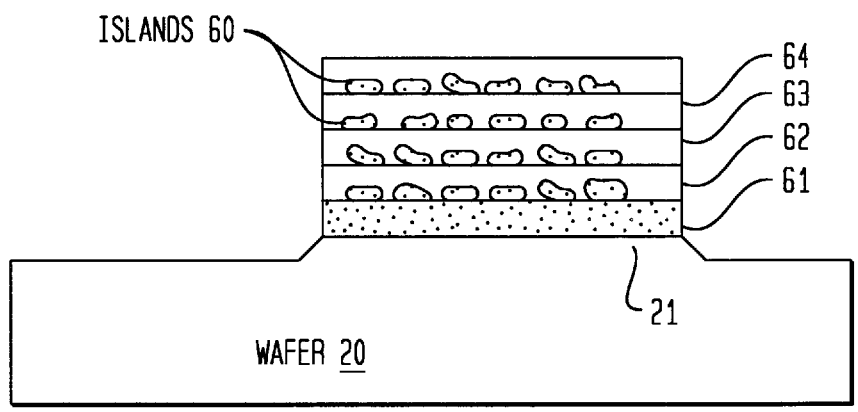

FIG. 6 is a schematic cross section of an exemplary resulting product showing a three-dimensional array of quantum dots 60 grown in four successive layers 61, 62, 63, 64 on the mesa 21. The quantum dot array of FIG. 6 can be used as a photodetector, for example, by applying electrodes (not shown) to either end. If the array is of III–V semiconductor material, it can be used as a gain medium for lasers.

Similar arrays can be fabricated with alternative materials. The key relationship is that the lattice constant of the buffer layer should be greater than or equal to the lattice constants of the substrate and the spacer layer. The lattice constant of the quantum dot layer should be greater than that of the buffer layer. For example, the substrate can comprise GaAs, the buffer layer can be $In_yGaAs_{1-y}$, and the islands can be $In_xGaAs_{1-x}$, where y<x. The tensioned layers can be GaAs. The array can be used as a gain medium in lasers, configured in either a surface emitting or a side emitting arrangement.

As another example, gallium indium phosphide can be used with a GaAs substrate. Preferably the dots are indium phosphide. The buffer and the spacing layer can both be GaInP (preferably $Ga_{0.52}InP$).

The invention will be more clearly understood upon consideration of the following specific example.

EXAMPLE

A 2 inch Si (100) p-type wafer having conventionally defined mesas (500 µm×500 µm) is cleaned by using an HF dip and by soaking in 5:3 $H_2SO_4/H_2O_2$. The cleaning cycle is repeated 3 times. The wafer is loaded into a molecular beam epitaxy (MBE) system and pumped down overnight to ultra high vacuum (UHV). The wafer is then heated in UHV at 900° C. for 5 minutes to desorb $SiO_2$.

The wafer temperature is lowered to 500° C. and 1000 Angstroms of $Ge_{0.1}Si_{0.9}$ and 100 Angstroms of Si are grown on the surface. The sample is removed from the MBE system and masked for the first lines of dislocation sources using standard photolithography. The dislocation lines are then made by Ge ion implantation at 50 KeV with a dose of $1\times10^{16}$ cm$^{-2}$ and the photoresist is subsequently removed. The sample is then annealed in a vacuum furnace at 550° C. for 10 hours. The second (perpendicular) dislocation lines are defined, similarly implanted and annealed at 600° C. for 4 hours.

The sample is then chemically cleaned, loaded into the MBE system, and heated in UHV at 900° C. for 5 minutes to desorb $SiO_2$. The sample temperature is lowered to 550° C. and alternate layers of 5 Angstroms Ge and 200 Angstroms of Si are grown. Growth of these alternate layers is repeated 10 times and the sample is removed from the MBE system. Electrodes can then be applied in a desired configuration.

It is to be understood that the above-described embodiments are illustrative of only a few of the many possible specific embodiments which can represent applications of the principles of the invention. Numerous and varied other arrangements can be readily devised in accordance with these principles by those skilled in the art without departing from the spirit and scope of the invention.

What is claimed:

1. A method for making a uniform three-dimensional array of quantum dots comprising the steps of:

a) making a regular two-dimensional array of quantum dots, said quantum dots comprising an array of islands of a first material grown on a surface of a second material with spacing between successive dots in the range 5 to 2000 Angstroms;

b) epitaxially growing a spacing layer of a third material under tensile strain over the two-dimensional array of quantum dots, thereby forming a planar surface while preserving preferential nucleation sites over the quantum dots of said underlying array; and c) epitaxially growing an additional array of quantum dots on said spacing layer at said preferential sites overlying the quantum dots of said underlying array.

2. The method of claim 1 further comprising repeating steps b and c for a plurality of times.

3. The method of claim 1 wherein said step of making a two-dimensional array of quantum dots comprises providing a substrate with a dislocation-free region; epitaxially growing a compressively strained buffer layer on said region; forming a grid of dislocation lines on said buffer layer; and epitaxially growing said two-dimensional array of quantum dots on said buffered layer.

4. The method of claim 3 wherein said substrate is provided with a dislocation-free mesa region.

5. The method of claimed 3 wherein said grid of dislocation lines is formed by introducing perpendicular lines of dislocation sources.

6. The method of claim 3 wherein said substrate comprises silicon.

7. The method of claim 3 wherein said substrate comprises gallium arsenide.

8. The method of claim 1 wherein said first material comprises Ge, said second material comprises GeSi and said third material comprises Si.

9. The method of claim 1 wherein said first material comprises $In_xGaAs_{1-x}$, said second material comprises $In_yGaAs_{1-y}$ where y<x and said third material comprises GaAs.

10. The method of claim 1 wherein said first material comprises indium phosphide and said second and third materials comprise gallium indium phosphide.

* * * * *